United States Patent
Scott (10) Patent No.: US 6,747,456 B2
(45) Date of Patent: Jun. 8, 2004

(54) ELECTRO-CHEMICAL DETERIORATION TEST METHOD AND APPARATUS

(75) Inventor: Nigel David Scott, Wilmslow (GB)

(73) Assignee: Guardian Link Limited (GB)

( * ) Notice: Subject to any disclaimer, the term of this patent is extended or adjusted under 35 U.S.C. 154(b) by 0 days.

(21) Appl. No.: 10/252,035

(22) Filed: Sep. 20, 2002

(65) Prior Publication Data

US 2003/0020478 A1 Jan. 30, 2003

Related U.S. Application Data

(63) Continuation of application No. 09/509,882, filed as application No. PCT/GB98/02949 on Oct. 2, 1998, now abandoned.

(30) Foreign Application Priority Data

Oct. 2, 1997 (GB) .............................................. 9720835

(51) Int. Cl.⁷ ............................................ G01N 27/416
(52) U.S. Cl. ..................... 324/426; 324/427; 324/428; 324/430; 324/433; 324/436
(58) Field of Search ................................. 324/426, 430, 324/428, 432, 427; 320/136, 134, DIG. 12; 424/433, 436; 702/65

(56) References Cited

U.S. PATENT DOCUMENTS

| | | | | |
|---|---|---|---|---|
| 3,873,911 A | * | 3/1975 | Champlin | 324/430 |
| 4,678,998 A | * | 7/1987 | Muramatsu | 324/427 |
| 4,697,134 A | * | 9/1987 | Burkum et al. | 320/134 |
| 4,968,941 A | * | 11/1990 | Rogers | 324/428 |
| 5,140,269 A | * | 8/1992 | Champlin | 324/433 |
| 5,241,275 A | * | 8/1993 | Fang | 324/430 |
| 5,598,098 A | * | 1/1997 | Champlin | 324/430 |
| 5,650,937 A | * | 7/1997 | Bounaga | 702/65 |
| 5,773,978 A | * | 6/1998 | Becker | 324/430 |
| 5,889,386 A | * | 3/1999 | Koenck | 320/136 |
| 6,002,238 A | | 12/1999 | Champlin | 320/134 |
| 6,118,275 A | | 9/2000 | Yoon et al. | 324/427 |
| 6,167,349 A | | 12/2000 | Alvarez | 702/63 |

FOREIGN PATENT DOCUMENTS

| WO | Wo 93/22666 | * | 5/1992 | ......... G01N/27/416 |
|---|---|---|---|---|

OTHER PUBLICATIONS

S. L. DeBardelaben, A look at the impedance of a cell, IEEE 1988, pp394–397.*

Champlin, et al., "A Fundamentally New Approach to Battery Performance Analysis Using DFRA™/DFIS™ Technology" (No Date).

Robinson, "On–Line Battery Testing: a Reliable Method for Determining Battery Health?" IEEE, 1996.

Gabrielli, "Use and Application of Electrochemical Impedance Techniques", Solartron Part No. 12860013; Technical Report 24, Apr. 1997.

* cited by examiner

Primary Examiner—Andrew H. Hirshfeld
Assistant Examiner—Wasseem H. Hamdan
(74) Attorney, Agent, or Firm—Williams, Morgan& Amerson (57) ABSTRACT

A portable instrument capable of evaluating the electro-chemical deterioration of an object under test such as a multi-cell valve regulated battery (10) and comprising means capable of temporarily applying across a battery cell a controlled frequency electrical signal derived from an internal battery (11) within the instrument, the signal being an oscillatory current or voltage controlled injected signal, further means for detecting returned data resultant from the signal application, and utilizing the data and a tailored mathematical algorithm in dedicated computer software to derive the data required. Such an instrument may be used to test battery systems of the type required for uninterruptible back-up power supplies in large industrial installations.

18 Claims, 5 Drawing Sheets

ELECTRO-CHEMICAL DETERIORATION TEST METHOD AND APPARATUS

This is a continuation of previously U.S. application Ser. No. 09/509,882, entitled "Electro Chemical Deterioration Test Method and Apparatus," and filed Mar. 31, 2000, in the name of Nigel D. Scott. now abandoned, which is a 371 of PCT/GB98/02949 filed Oct. 2, 1998.

FIELD OF THE INVENTION

This invention concerns a method of and apparatus for detecting and evaluating the electro-chemical characteristics of an object under test, and is particularly though not exclutively, concerned with the measurement of the electrical service capacity of in-circuit sealed electro-chemical cells and monoblocs.

DESCRIPTION OF RELATED ART

The invention is especially concerned with the testing of battery systems of the type used to provide uninterruptible back-up power supplies in large installations such as computers, life support machines and radar controlled safety systems for air transport. Such back-up batteries are required so that if the mains supply should fail, they must provide electrical supply to their critical loads instantaneously or at least in no more than a millisecond or two.

Such batteries may be composed of several hundred cells with a design life of up to 12 years and costing perhaps several hundreds of thousands of pounds.

In-situ testing of such batteries is an essential requirement since such cells are connected in series or series-parallel, and if only one cell of a standard battery becomes faulty the entire-back-up supply may be lost.

The failure of such battery systems is quite common causing considerable damage to the critical loads which they supply.

Managerial personnel of large computer centres, air traffic control systems, etc. which depend upon such back-up power supplies generally will not allow their critical loads to be used to test the system and so, conventionally, all such tests carried out on standby battery supplies involve the temporary shutting down of dependent systems in order to avoid consequent damage should the mains supply fail during the test. Upon shut-down the entire back-up battery is disconnected from the installation and connected to a large DC load bank and then submitted to a standard discharge test lasting up to three hours. Such tests are normally carried out once or twice per annum and this typically can necessitate the critical load being off-line for up to three days. In addition, conventional testing typically consumes many hundreds of kilowatts of power, the energy being, "burnt off" as heat which results in considerably waste of time and energy resource.

A principal object of the present invention is to provide a portable instrument capable of testing individual cells or monoblocs in-situ, i.e. without disconnection of the back-up supply and without endangering the dependent system should the mains supply fail during the test.

The system should enable discharge testing of a single cell in a battery of multiple cells, while the cell is still in circuit and with no disruption to the on-line system. Preferably, after testing an entire battery and finding it to be, as al whole, in good condition a tertiary element of the system will enable sample discharge tests to be conducted on a small number of cells so that the whole battery condition can be extrapolated, obviating the necessity for an annual discharge test and showing notable savings to the end user in terms of down time, manpower and energy expenditure. The ability of an instrument to identify deterioration in a single cell, in batteries of many hundreds of cells, will enable an engineer to target and replace only weak or failing cells thus greatly extending the working life of the entire battery, saving not only on costs and manpower but also energy consumption.

According to the present invention there is provided a method of deriving data concerning the electro-chemical characteristics of an object under test, comprising the steps of providing a portable instrument capable of temporarily applying across the object a controlled frequency electrical signal derived from an internal battery of the instrument, detecting returned data resultant from said application and utilising the returned data and a tailored mathematical algorithm in dedicated computer software to derive the data required.

Particularly though not exclusively the method is used to measure the service capacity of individual cells of multi-cell valve regulated lead-acid batteries while in service, and to store the resultant data for subsequent analysis.

Still further, the invention concerns an instrument adapted to carry out the aforesaid method.

BRIEF DESCRIPTION OF THE DRAWINGS

An embodiment of the invention will now be described, by way of example only, with reference to the accompanying drawings, in which.

DETAILED DESCRIPTION OF THE INVENTION

In order to appreciate the innovative content of an instrument designed in accordance with the present invention it is necessary to consider two conventional methods used for service capacity measurement of sealed lead acid cells and monoblocs. These consist essentially of measuring the AC impedance (or AC conductance) and the DC resistance of electro-chemical cells. These parameters are known to change with age and state of charge, rising gradually over the life of the cell, or sharply as the cell reaches the end of a discharge.

Figure 1:
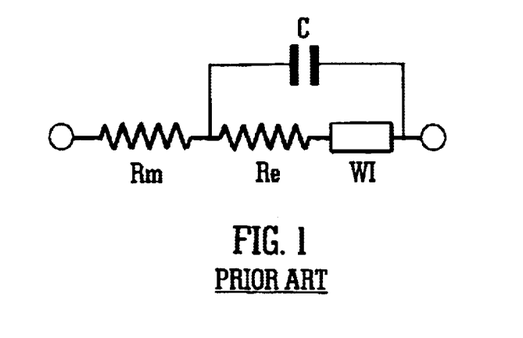
FIG. 1 is a diagram illustrating the internal resistance circuit of a battery cell.

The equivalent internal resistance circuit of a cell is illustrated with reference to FIG. 1 where Rm is the metallic resistance, Re is the electro-chemical resistance, C is the total capacitance, and WI is the Warburg impedance, or mass transport impedance, of the cell.

Simple AC impedance is easier to measure accurately in-situ than DC resistance. It is known that cell AC impedance changes with loss of charge and capacity, and there are instruments presently available which use AC impedance to detect and predict the condition of cells in service.

Figure 2:
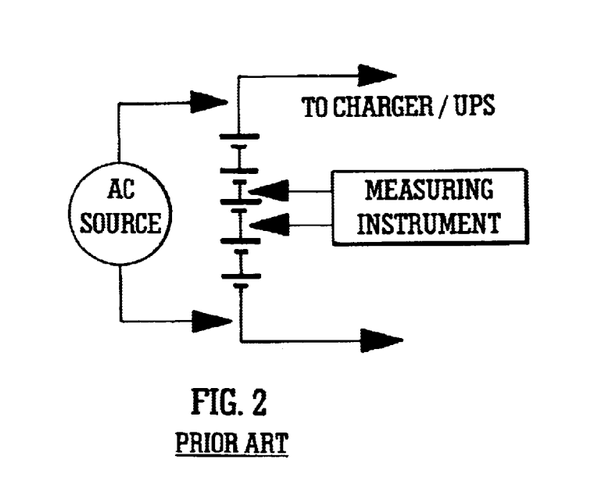
FIG. 2 is a diagram illustrating the conventional system for measuring simple AC impedance in a cell.

FIG. 2 illustrates the principal features of a known instrument to detect AC impedance where an AC signal source is coupled across the battery as a whole and the measuring instrument is clipped across each cell or monobloc in turn. The decoupled AC voltage and current through the cell is then measured and the simple impedance computed. Since the signal is AC there is no net current flow. Systems operating in this manner are considered to be accurate to plus or minus 5% but there are several drawbacks with this type of equipment as follows. Simple (non-complex) impedance measurements of cells are subject to many factors which may cause to confuse the estimation of capacity. These can be of such significance that in some circumstances simple impedance bears only an indirect relationship to the ability of a cell to deliver its required current. For example, dendritic growth on the plates of the cell can produce a lowering of the cell impedance, which tends to disguise the raised resistance of an aging cell so that the cell appears more healthy than is appropriate, In addition, the cell capacitance is surprisingly. Large, more than 1.5 Farads per 1 Ah in some cases, and this changes in far greater proportion than the cell resistance component with the charge/discharge cycles experienced during the lifetime of the cell.

Warburg impedance (mass transport impedance) is present during lower frequency measurement.

If these components are not identified and accounted for which is not possible using simple impedance measurement, then the veracity of the measurements can be obscured.

Very few battery manufacturers provide impedance values for their generic cell types so that capacity or remaining service life cannot easily be calculated against a known datum but is only valid when compared against several cells from the same battery, a cell being considered suspect when it differs from normal by plus or minus 25 to 30%.

In sensitive installations it may not be desirable to connect an AC signal across the DC terminals of a battery since this may influence the inverter or load system and in fact many system engineers will not allow this type of testing to be carried out without disconnection of the load. Furthermore, mains power is required for an AC testing instrument, making it unsuitable where mains access is difficult.

Figure 3:
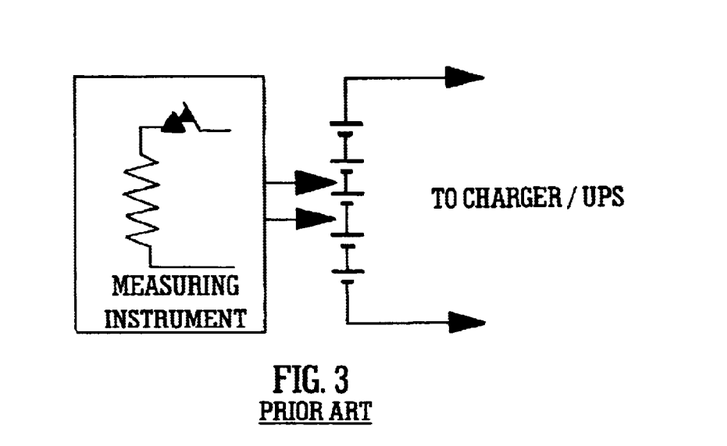
FIG. 3 is a diagram illustrating a system for measuring simple DC resistance in a cell.

Considering now the alternative of using DC resistance to test the cells of a battery this would appear to be the method providing the best single piece of information about the cell since it is held mainly to change with loss of active surface area on the positive plate and hence the ability of the cell to deliver its rated capacity. Additionally, many battery manufacturers do provide resistance values for their generic cell types. It is not possible to apply the manufacturers method of measuring cell internal resistance since the cell under test is in circuit but an alternative method as illustrated in FIG. 3 comprises attaching the terminals of an instrument across the individual cell or monobloc terminals, and connecting a low resistance (virtually a short circuit) which is internal to the instrument, across the cell for several seconds dropping the cell apparent DC terminal voltage and stressing the cell. The current and voltage are measured at the moment before disconnection of the resistor, and again the moment after. The change in cell volts, over the current, is considered to provide an indication of the cell internal resistance. Claims for the accuracy of this method are limited to repeatability which is stated to be plus or minus 5%.

The accuracy of the DC resistance measurement method is dependent upon a number of factors other than the internal resistance, such as terminal float voltage.

DC resistance itself however can give an indication of either the state of charge of the cell or its general condition but it cannot differentiate between these conditions unless readings are taken over long periods of time when trends can be averaged out. However the system does have the advantage that it can run from an internal battery making it more flexible than the impedance instrument.

Problems encountered with this method of measuring using simple DC resistance are for example that all capacitors have a leakage resistance, and the electro chemical cell is no exception. With reference to FIG. 1 it can be seen that if the capacitor C has a DC leakage resistance which is dependent upon the value of the capacitance, then the overall resistance of the cell will be effected and in particular the electrochemical resistance, arguably the most important part, since if analysed correctly this can indicate such conditions as drying out, dendritic growth, and plate corrosion due to aging.

Again with the DC resistance method if the cell is stressed during the test by having 50 to 100 amps drawn from it there is a net current loss and a chemical change in the cell. This has the effect of raising the float voltage across the remaining cells of the battery and as the test progresses there is a noticeable rise in individual cell terminal voltage, thus invalidating the voltage reading in the later-tested cells.

Furthermore, the method takes no account of capacitance which changes more radically than DC resistance for a given chemical difference, and can be an important indicator of both condition and state of charge.

In conclusion, the conventional methods are both somewhat unsatisfactory. AC impedance is the preferred method of acquiring cell data since it can potentially provide far more information than simple DC resistance, allowing true analysis of the various factors involved, and since there is no net current flow, the cell under test and the remaining cells in the battery are not effected by resultant chemical changes. Such an instrument would be considerably improved if it did not inject its source signal across the entire battery. Simple impedance, however, is not capable of providing sufficient information to make accurate judgments about the condition of the cell under test.

Figure 4:
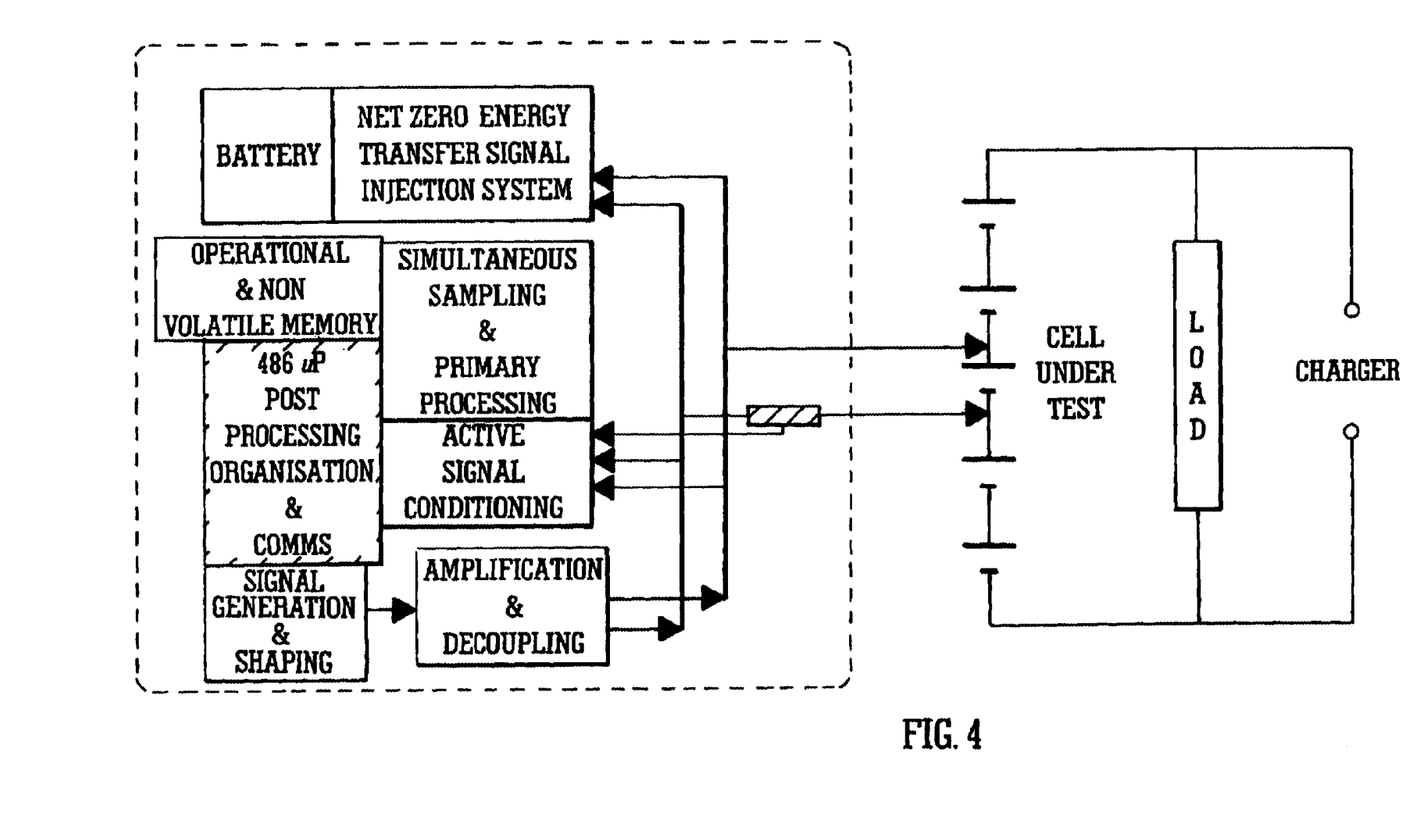
FIG. 4 is a diagram illustrating the principal components of an instrument for performing a testing method in accordance with the invention.

Therefore, in accordance with one embodiment of the invention an instrument is provided which is designed to be portable, i.e. of sufficiently low mass to be carried while testing, over extended periods and without strain to the operator. Such an instrument is illustrated in FIG. 4 and is operated by attaching its leads across the terminals of a cell under test while the cell is still in circuit, under float charge conditions. Within the instrument is a component adapted to generate a compound pseudo random noise or cyclic waveform signal which is applied across the terminals of the cell. The reaction of the cell is measured and an original complex mathematical algorithm combined with computer software installed within the instrument is used to derive comprehensive data on the electrical constituents of the cell. The data is stored, together with the DC terminal voltage, float current and cell ambient temperature readings, and used in a post-test model to indicate the cell's capacity and predict its remaining service life. This information will be provided both numerically and graphically.

An active load which can be integrated with the instrument will enable sample cells to be discharge tested to extract parameters which will determine absolutely the ability of the cell to support the critical load when called upon to do so. The data may be subsequently down loaded onto a floppy disc for further evaluation and archiving.

The instrument, in generating pseudo random noise or multi-frequency waveform employs a technique not previously used in this field and which will enable precise measurement of the cell's electro-chemical constituents and enable analysis to determine the extent of plate corrosion and electrolyte exhaustion. The test signal when combined with an ultra-fast analogue measurement system and an original algorithm utilising inferential mathematical measurement techniques and others, will, together, derive individual resistive and capacitive components from the precisely measured feedback.

The operator may not always be able to interpret the raw measured data in such a way as to determine cell status and life criteria. Therefore, in order to provide an authoritative indication of the cell's condition and probable service life a second mathematical model based on complex impedance values and others such as DC current and temperature will be provided so that in addition to the ability to view data and graphical representations of the cell's characteristics there will be provided a simple graphical interpretation of actual capacity.

The test signal applied to the electrochemical process may be any oscillatory current or voltage controlled injected signal, for example, sinusoidal, square wave, sawtooth, step and ramp. The derived signal will be measured for both current and voltage simultaneously.

When the test signal employed is of an oscillatory nature, an electrical circuit known as a flying bridge enables the battery internal to the instrument to be utilised in such a manner as to have zero nett energy transfer (excluding losses) between the cell under test and the instrument's internal battery.

Figure 5:
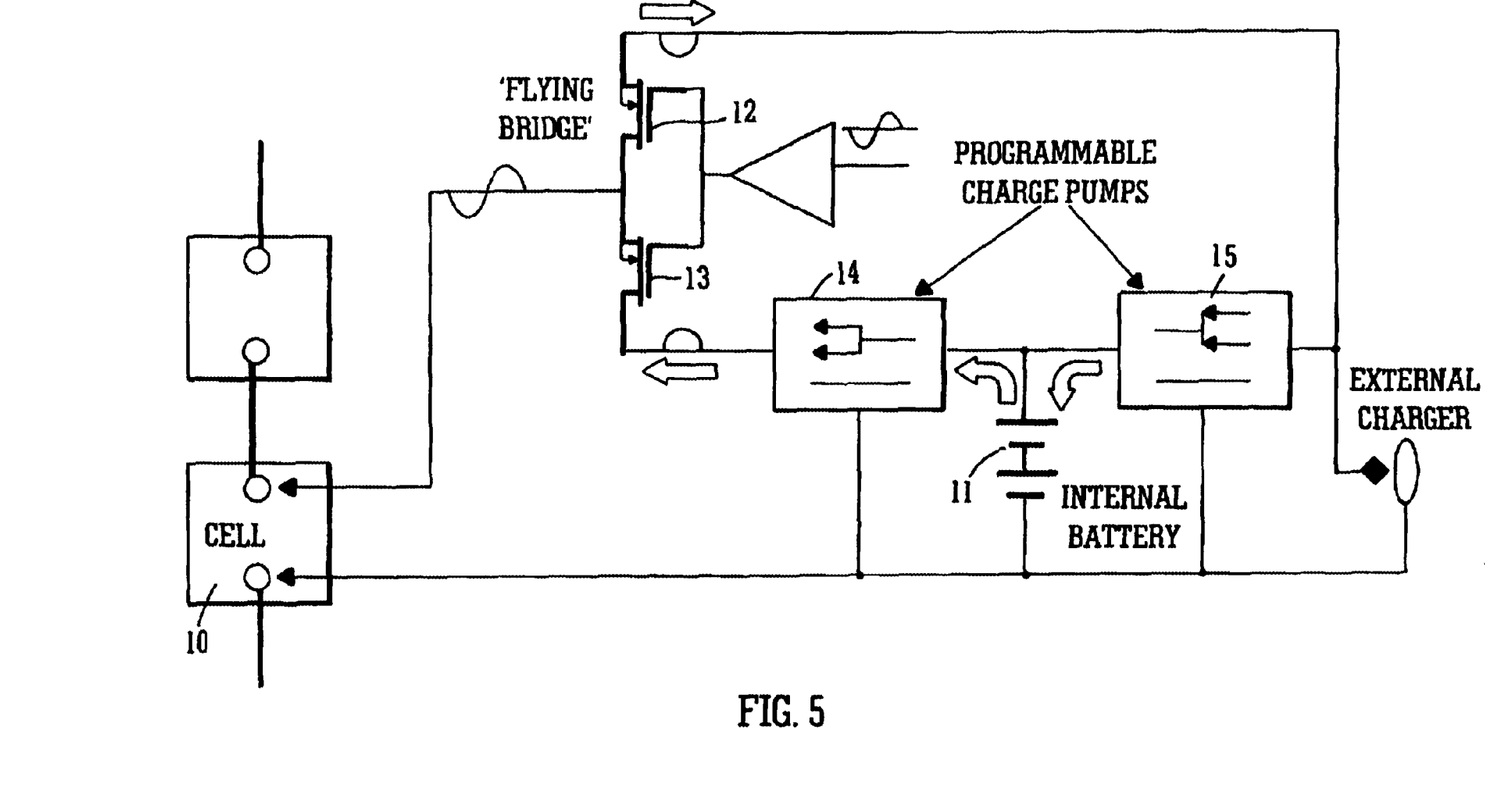
FIG. 5 is a circuit diagram of a part of the instrument.

Referring now to FIG. 5 the operation of the flying bridge is as follows. When the test signal to be injected into the cell 10 under test is, for example, a sine wave, the positive half cycle is derived from the instrument's internal battery 11 via the bridge transistor 13, and applied to the cell 10, and the negative half-cycle is derived from the cell 10 via the transistor 12 and applied to the instrument's internal battery 11. Since the cell or monoblock under test can be of a voltage between 1 and 12 volts and the internal battery must be of a fixed voltage, perhaps in the middle of the above range, programmable charge pumps 14 and 15 must be employed to change the voltage levels of the two alternating sources and enable the internal battery 11 to force current through the cell under test, and vice versa.

The system provides a facility for the battery to be "micro-recharged" from the cell under test, after the test series without extending the test longer than 8 seconds. In addition the same system will have the ability to recharge completely the internal battery 11 over an extended period.

Use is made a new and original inferential measurement technique (mathematical algorithm) to resolve the returned measured complex impedance data into its equivalent circuit electrical constituents, from a signal applied to the external terminals of the cell. An example of a mathematical algorithm for this purpose is given as follows.

It has been shown that the dynamics of a cell can be represented by the Randles equivalent circuit. The transfer function of which is:

$$\frac{v(t)}{i(t)} = \frac{(R_i + R_\Omega) + R_t R_\Omega C_{dt} s}{1 + R_i C_{dt} s} \quad (1)$$

The problem to be solved is the explicit identification of these equivalent circuit parameters. To achieve this, the Laplace transfer function has to be converted in a form suitable for identification.

$$v(t) + v(t)R_i C_{dt} s = (R_i + R_\Omega)i(t) + R_t R_\Omega C_{dt} si(t) \quad (2)$$

Rearranging:

$$v(t) = -v(t)R_i C_{dt} s + (R_i + R_\Omega)i(t) + R_t R\Omega C_{dt} si(t) \quad (3)$$

Identification requires measurements of input/output data to be made. This introduces sampling in to the system and the model has to be converted into a discrete form to incorporate the sampling effect. The delta operator has been adopted in this work rather than the shift operator, because it has superior numerical properties and the coefficients in a delta model tend to show a closer resemblance to the coefficients in the continuous model (allowing easier interpretation of results) compared to the use of the a model based on the shift operator.

Thus we define the delta (difference) operator $$\delta y(t) = \frac{y(t) - y(t-1)}{\Delta} \quad (4)$$

where $\Delta$ is defined as the sample time between measurements.

Replacing the Laplace operator (s) with the delta operator $\delta(t)$ in equation (3)

$$v(t) = -\delta v(t)R_i C_{dt} + (R_i + R_\Omega)i(t) + R_t R_\Omega C_{dt} i(t) \quad (5)$$

Define:
$K = R_t + R_\Omega$
$\tau_1 R_t R_\Omega C_{dl}$
and $\tau_2 = C_{dt} R_t$ resulting in a model which can be identified from input/output data.

$$v(t) = -\delta v(t)\tau_2 + Ki(t) + \tau_1 \delta i(t) \quad (6)$$

Statistical estimation techniques can then be used to estimate the parameter values ($\tau_1, \tau_2, K$) of the model from input/output data, generated by applying a current tint signal to the cell and logging the resulting voltage output data.

Using standard notation, define:

$$v(t) = x^1(t)\theta + e(t) \quad (7)$$

where 0 is the vector of unknown parameters defined by:

$$\tau = [\tau_1 K \tau_2] \quad (8)$$

and e(t) is the regression vector consisting of measured input/output data defined by:

$$x^T(t) = [\delta v(t) i(t) \delta i(t)] \quad (9)$$

and A(ft) is an unobservable white noise disturbance.

We wish to determine from available data, the vector 0 of the true system parameters. It is assumed that sufficient operating data has been collected from the system allowing eqn (7) to be recast in matrix form as:

$$\begin{bmatrix} v(1) \\ \vdots \\ v(N) \end{bmatrix} = \begin{bmatrix} x^T(1) \\ \vdots \\ x^T(N) \end{bmatrix} \hat{\theta} + \begin{bmatrix} \hat{e}(1) \\ \vdots \\ \hat{e}(N) \end{bmatrix} \quad (10)$$

where N is the number of observations and the modelling error is a combination of the white noise disturbance and the difference between the actual and estimate parameter values:

i.e. $\hat{e}(t) = e(t) + x^T(t)(\theta - \hat{\theta})$ (11)

The aim is to estimate the parameter vector θ using Least Squares. Rewriting eqn (10) in stacked notation:

$$V = X\hat{\theta} + \hat{E}$$

where $V = [v(1) \ldots v(N)]$, $\hat{E}^T = [\hat{e}(1) \ldots \hat{e}(N)]$ and $$X = \begin{bmatrix} x^T(1) \\ \vdots \\ x^T(N) \end{bmatrix} \quad (12)$$

it can be shown that by minimising the sum of squares of the modelling errors, the least squares estimator for the unknown parameter vector is:

$$\hat{\theta} = [X^T X]^{-1}[X^T V] \quad (13)$$

Relevant implementations issues such as bias on estimates resulting from non-white measurement noise and computational efficiency resulting from recursive implementations of eqn (13) will be highlighted where necessary in the next progress report which will focus on the application of the identifier to practical data obtained from an actual battery.

From equation (13), values for the parameters ($\tau_1$, $\tau_2$, K) are obtained. Using a process of back substitution, values for the equivalent circuit components are obtained from ($\tau_1$, $\tau_2$, K). i.e.

$$R_\Omega = \frac{\tau_1}{\tau_2} \cdot R_i = K - R_\Omega \text{ and } C_{dt} = \frac{\tau_2}{R_t} \quad (40)$$

The derived signal to be measured will be measured for both current and voltage simultaneously. An electrical circuit to enable the system to remove any DC voltage level from the measurement, in order to ensure greater AC voltage accuracy is illustrated in FIG. 6.

Figure 6:
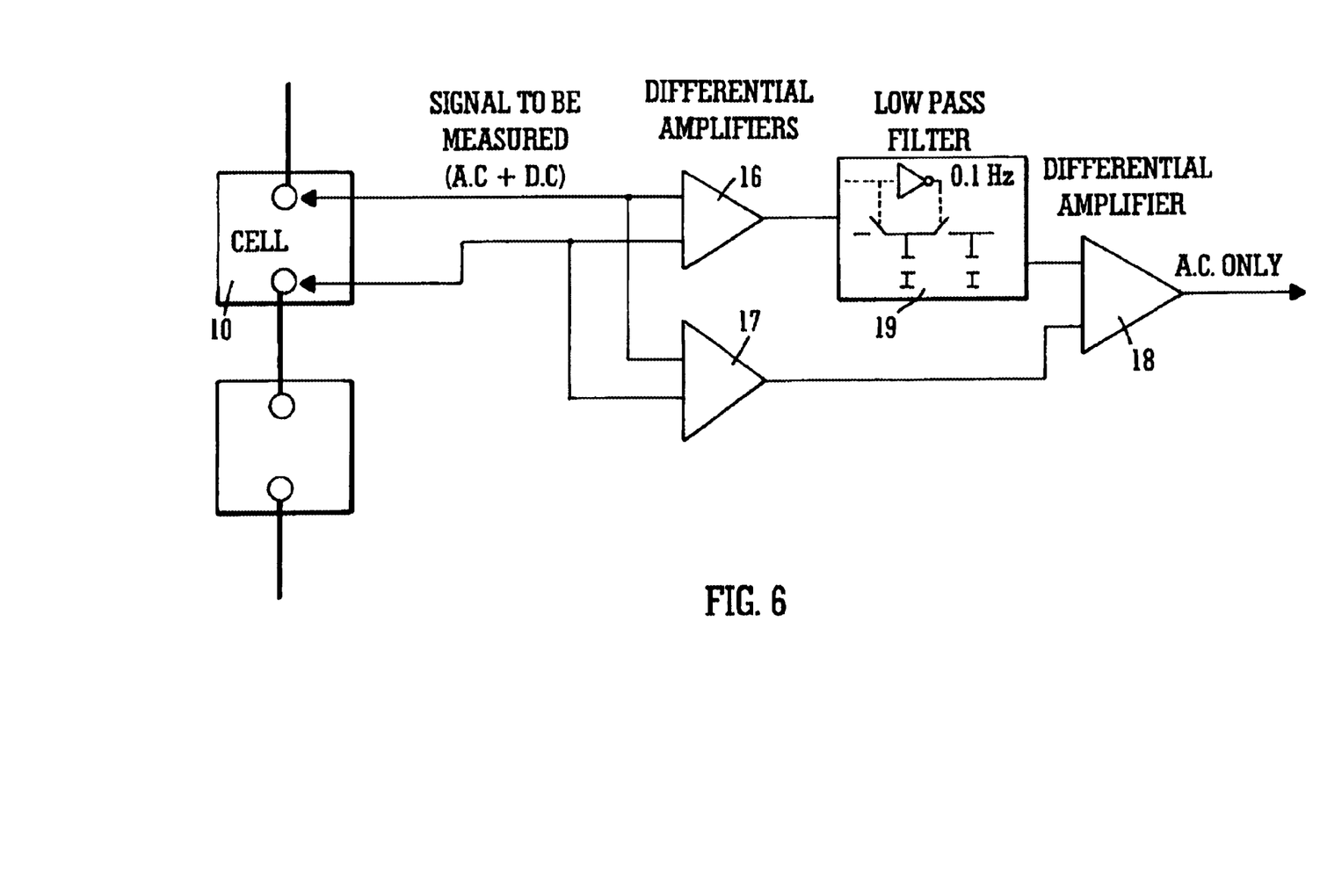
FIG. 6 is a circuit diagram of a further part of the instrument.

Referring now to FIG. 6, it is required that a few microvolts of injected AC signal can be measured when the DC terminal voltage of the cell or monoblock under test can be up to 15 volts. Therefore, an original circuit to eliminate the DC voltage has been defined. The incoming signal to be measured is applied to two similar differential amplifiers 16 and 17 which pass only the differences between the input signals. One of the two resulting AC plus DC signals is passed directly to a second differential amplifier stage, while the second signal is routed through a low pass filter 19 to remove the AC signal voltage. The second differential amplifier stage 18 thus detects AC plus DC on one input and pure DC at the same potential on the other. Since only the difference is passed, the final signal output is pure AC and can be amplified for measurement in the usual way. This circuit is important not only for battery testing but as an example also for the evaluation of cathodic protection system corrosion, where the installed system relies on a continuous low-voltage DC current for its protective characteristics.

Figure 7:
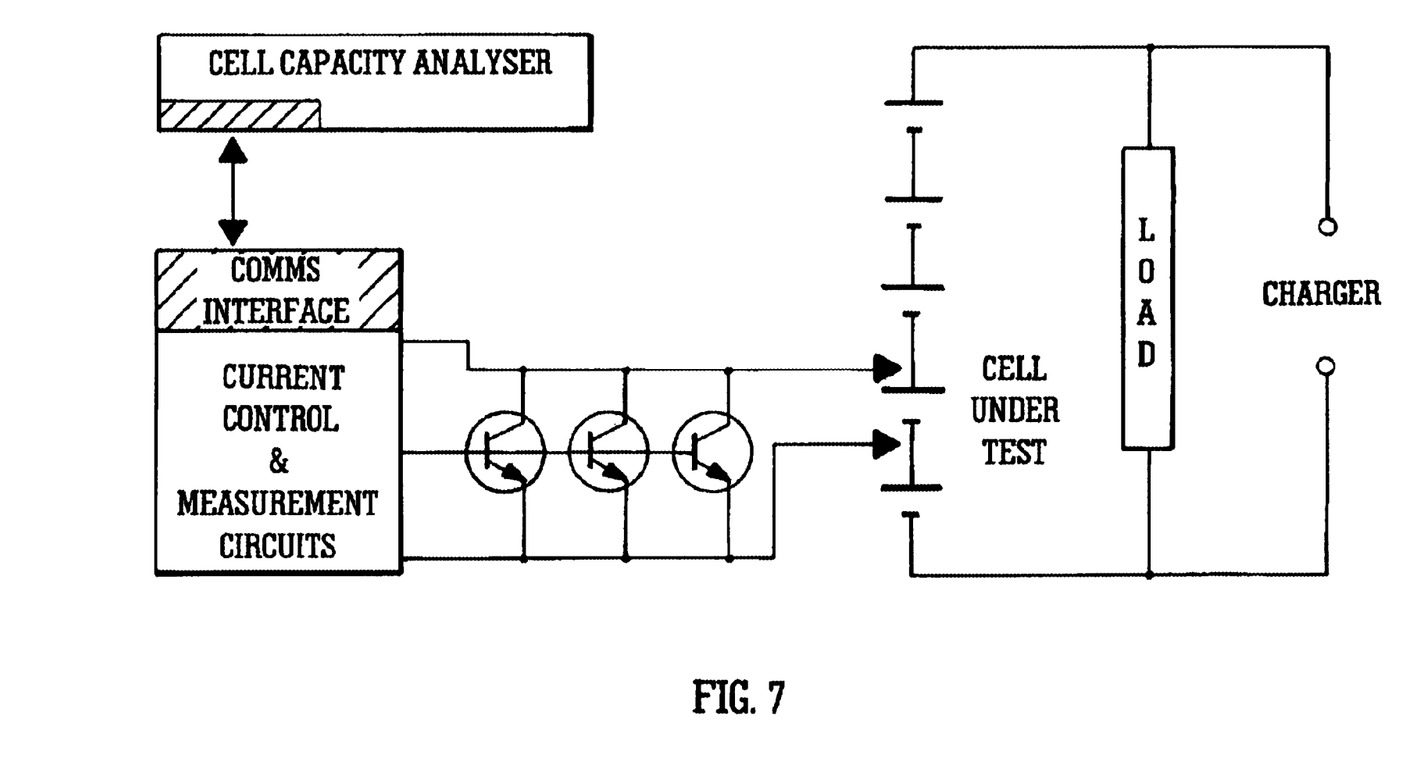
FIG. 7 is a circuit diagram of an ancilliary testing module.

A major problem in the testing of on-line cells and monoblocs is what the user does when the test instrument indicates that cells are riot healthy. They may be on the borderline, and the engineer will want to know is they can hold up sufficiently to wait for change-out until the next maintenance period. Therefore, referring to FIG. 7, there is provided a small active portable load system, to autonomy (discharge) test a single cell or monobloc while in-circuit, under float charge conditions.

Several important issues make up the inventive concept upon which this method and instrument are based. These may be expressed as follows:

1. the application of an electrical current comprised from, for example, tailored pseudo random noise by a battery-powered instrument to an electrochemical cell in-situ;
2. the application of this signal while the cell is in circuit in series with other cells under float charge conditions;
3. the use of inferential mathematical measurement techniques and others to resolve the returned measured data with complex impedance, into its electrical constituents, from a signal applied to the external terminals of the cell;
4. converting the resolved data, in combination with other data such as DC terminal voltage, cell ambient temperature and cell DC charge current, into a definitive statement of the performance and reliability of the cell;
5. the ability to discharge test an individual cell while in circuit, under float charge conditions. This will be closely controlled, and the discharge current, terminal voltage and cell ambient temperature will be monitored and recorded by the instrument. The discharge will he of sufficient length, and the instrument will analyse resultant data and give a definitive indication as to the capacity of the cell to deliver its required current for a specified period of time. The load will have the ability to recharge the cell to within 80% of pre-test levels before the in-situ float charging system takes over; and
6. The ability of the instrument to recharge its internal battery from the cell under test while the cell is in circuit. This will be done automatically for two or three seconds during the test but can be later coupled to a supply for an extended period of time for a complete recharge.

Whilst the method in accordance with the invention, and the instrument designed to carry it out, have evolved from the need accurately to test sealed lead acid battery cells in-situ and in circuit, nevertheless the method and an instrument appropriately designed to carry it out may also apply to many other endeavours such as the detection of deterioration (corrosion) of metallic water pipes and the like, metal in concrete, metal in solution, and metal protective coatings. Conceivably, also, the method may be applied to the measurement of electrochemical deterioration of any object across which it is possible to apply an electrical current, the method employing the measurement of complex AC impedance by injecting an

What is claimed is:

1. A method of deriving data concerning the electrochemical characteristics of a plurality of individual electrochemical cells or corrosion processes, comprising the steps of:

providing an instrument capable of temporarily applying across a cell or a process a controlled multi-frequency electrical signal, detecting returned data resultant from said application, and utilizing the returned data with computer software algorithms to resolve the data into at least three of its electro-chemical constituents, including a series metallic resistance ($R_\Omega$). an electro-chemical resistance ($R_e$), and a double-layer capacitance ($C_{dl}$).

2. A method according to claim 1, when applied to measure the service capacity of individual cells of multi-cell valve regulated lead-acid batteries while in service, the resultant data being stored for subsequent analysis.

3. A method according to claim 1, wherein the controlled frequency electrical signal is an oscillating signal.

4. A method according to claim 1, wherein the controlled frequency electrical signal is pseudo-random noise.

5. A method according to claim 1, wherein the returned data is measured for both current and voltage simultaneously.

6. A method according to claim 5, wherein the DC component of the measured data is removed therefrom.

7. A method according to claim 1, wherein when the controlled frequency electrical signal is sinusoidal, a flying bridge is included whereby the positive half-cycle is derived from the instrument's internal battery via the bridge and applied to the cell or process, the negative half-cycle is derived from the cell or process, and applied to the instruments internal battery whereby the internal battery may be recharged from the cell or process in a minimal period.

8. A method according to claim 1, including the use of a second mathematical model based on complex impedance values and others such as DC current and temperature whereby in addition to the ability to view data and graphical representations of the characteristics of the cell or process there is also provided a simple graphical interpretation off the actual characteristics.

9. A method according to claim 1, wherein the instrument is applied to scaled, valve regulated open lead-acid cells to measure the service capacity of individual cells of a multi-cell battery while in service under float charge conditions and causing an internal battery of the instrument to be recharged from the battery cells under test.

10. A method according to claim 5, wherein the instrument is operated such that substantially no net energy transfer occurs between the instrument and the object under test.

11. A method according to claim 1, wherein the data is resolved into at least three of its electro-chemical constituents, including capacitance.

12. The method of claim 1, wherein the instrument is portable.

13. The method of claim 1, wherein the controlled frequency electrical signal is derived from an internal battery of the instrument.

14. The method of claim 1, wherein the controlled frequency electrical signal is derived from one of the electro-chemical cells.

15. A method of deriving data concerning the electro-chemical characteristics of a plurality of individual electro-chemical cells or corrosion processes, comprising the steps of:

providing an instrument capable of temporarily applying across a cell or a process a controlled multi-frequency electrical signal derived from an internal battery of the instrument, applying the instrument to a plurality of sealed, valve regulated open lead-acid cells to measure the service capacity of individual cells of a multi-cell battery while in service under float charge conditions and causing an internal battery of the instrument to be recharged from the battery cells under test, detecting returned voltage and current data resultant from said application;

utilizing the returned data with computer software algorithms to resolve the data into at least three of its electro-chemical constituents, including a series metallic resistance ($R_\Omega$), a parallel electro-chemical resistance ($R_e$). and a double-layer capacitance ($C_{dl}$); and storing the data resulting from the application for subsequent analysis.

16. A method according to claim 15, wherein the controlled frequency electrical signal is an oscillating signal or a pseudo-random noise.

17. A method according to claim 15, wherein when the controlled frequency electrical signal is sinusoidal, a flying bridge is included whereby the positive half-cycle is derived from the instrument's internal battery via the bridge and applied to the cell or process, and the negative half-cycle is derived from the cell or process, and the negative half-cycle is derived from the cell or process and applied to the instrument's internal battery whereby the internal battery may be recharged from the cell or process in a minimal period.

18. A method according to claim 15, including the use of a second mathematical model based on complex impedance values and others such as DC current and temperature whereby in addition to the ability to view data and graphical representations of the characteristics of the cell or process there is also provided a simple graphical interpretation of the actual characteristics.

* * * * *